United States Patent [19]

Kosch

[11] Patent Number: 4,992,739

[45] Date of Patent: Feb. 12, 1991

[54] CONTINUITY TESTER

[76] Inventor: James J. Kosch, 1730 Woodland Dr., Columbus, Nebr. 68601

[21] Appl. No.: 379,068

[22] Filed: Jul. 13, 1989

[51] Int. Cl.⁵ .......................................... G01R 31/02
[52] U.S. Cl. .................................... 324/540; 324/66; 379/10; 379/26
[58] Field of Search ................. 324/539, 540, 66, 542; 340/652; 379/10, 25, 26

[56] References Cited

U.S. PATENT DOCUMENTS 2,932,791  4/1960  Carrington ..................... 324/540 X
4,445,086  4/1984  Bulatao ................................ 324/66
4,736,158  4/1988  McCartney .......................... 324/66

Primary Examiner—Reinhard J. Eisenzopf
Assistant Examiner—Robert W. Mueller
Attorney, Agent, or Firm—Zarley, McKee, Thomte, Voorhees & Sease

[57] ABSTRACT

A continuity tester comprising a transmitter operatively connected to the ends of a plurality of wires which are extended through an electrical conduit. The other ends of the wires are connected to a receiver unit. The transmitter sequentially supplies power to the individual wires connected thereto with diodes being sequentially illuminated at the receiver to establish the identification and continuity of the individual wires.

2 Claims, 4 Drawing Sheets

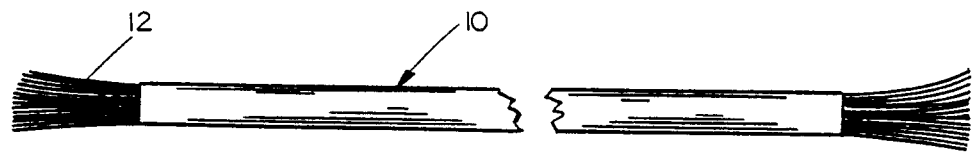
FIG. 1
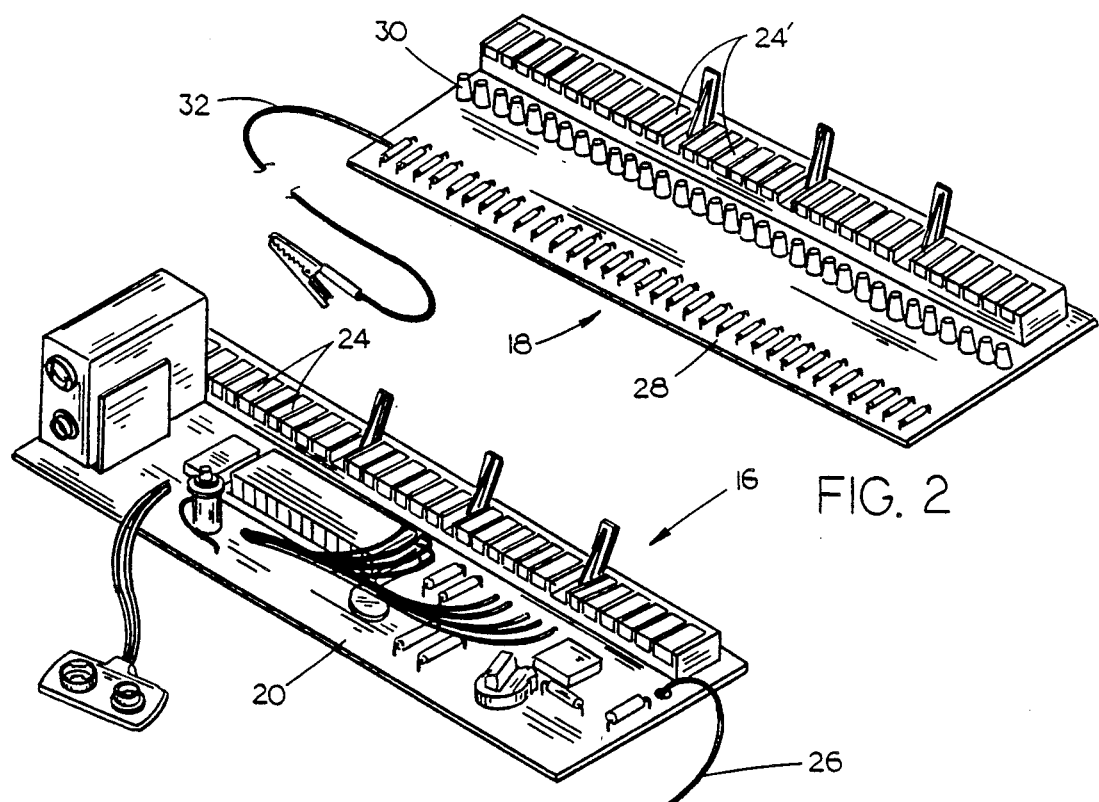
FIG. 2
FIG. 3

CONTINUITY TESTER

BACKGROUND OF THE INVENTION

In many factories or the like, it is frequently necessary to run electrical wires considerable distances from the source of power to the machine requiring electrical power. The wires are normally pulled through an elongated metal conduit to conform to the standard electrical code. Once the wires have been pulled through the conduit, it is very difficult to establish continuity. In other words, it is difficult to ascertain the identity of the individual wires once they have been pulled through the conduit. In some case where only two-to-five wires are utilized, the wires may be color coded. However, the same is impractical when a large number of wires are run through the conduit. Further, various colored wires are not normally used in factories or the like.

One way of determining the continuity of an individual wire or to identify individuals is to supply a current to one end of an individual wire and then laboriously test the other ends of the wires until the particular is identified as having current flowing therethrough. Such is time consuming and labor intensive.

It is therefore a principal object of the invention to provide an improved continuity tester.

A further object of the invention is to provide a continuity tester which is of the scanning type.

Yet another object of the invention is to provide a continuity tester which automatically and sequentially supplies power to a plurality of electrical wires with means provided at the other end of the wires for sequentially indicating the continuity of the wires.

Still another object of the invention is to provide a continuity tester which is reliable and easy to use.

These and other objects will be apparent to those skilled in the art.

BRIEF DESCRIPTION OF THE DRAWINGS

FIG. 1 illustrates a plurality of wires extending through a conduit with the continuity tester of this invention;

FIGS. 2 and 3 are perspective views of the tester of this invention; and

SUMMARY OF THE INVENTION

Figure 4:
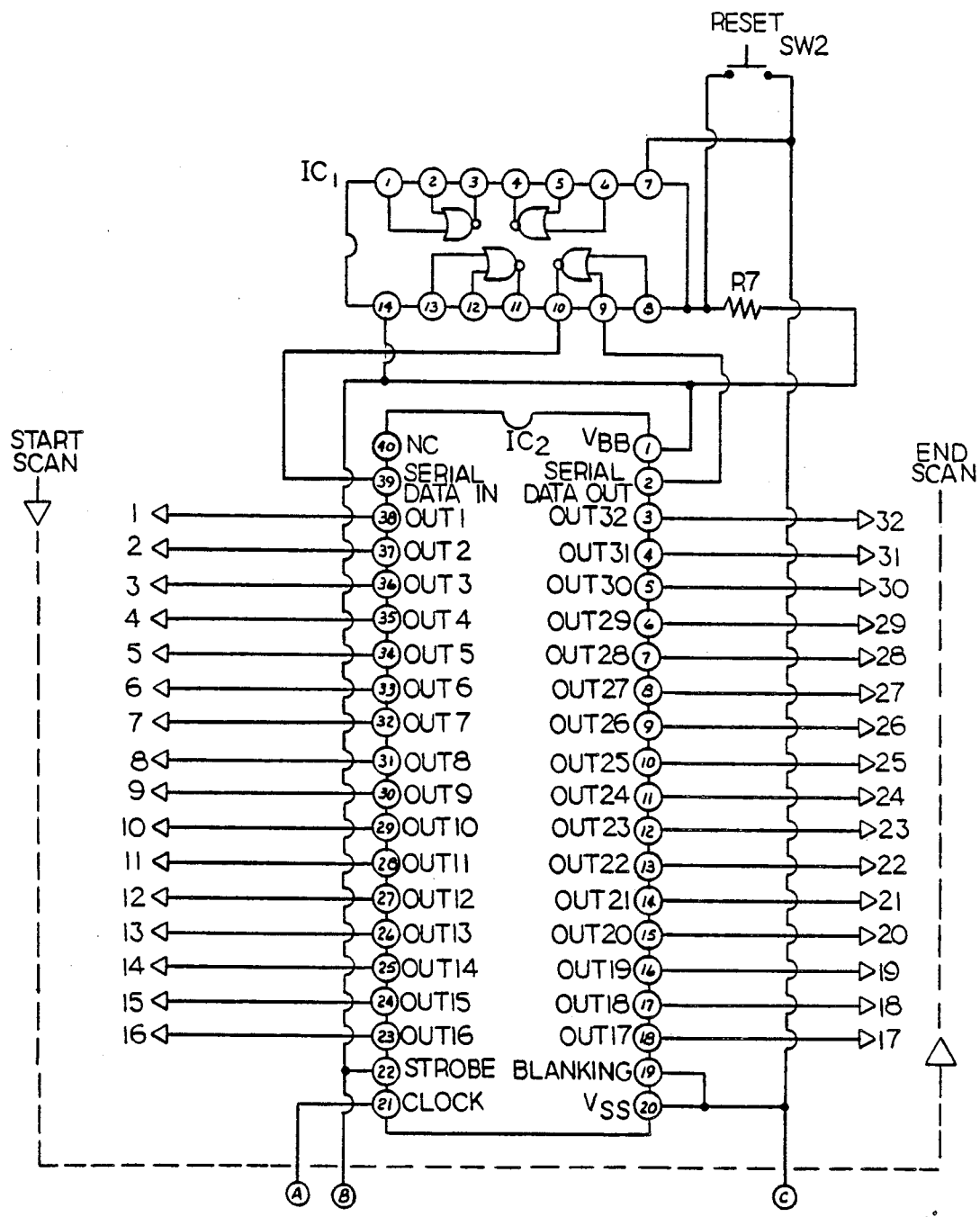
FIGS. 4, 5 and 6 are electrical schematics of the circuitry of the invention.

A continuity tester is described which comprises a scanning transmitter which is connected to one end of each of the wires of a plurality of wires extending through an electrical conduit and a receiver electrically connected to the other ends of the wire. The wires are electrically connected to the transmitted and are sequentially numbered or otherwise identified. Electrical power is supplied to the first wire in the plurality of wires and a diode is illuminated at the receiver portion of the invention to indicate that the wire operatively associated with that particular diode is the same wire which is being supplied with current. That wire is then disconnected from the receiver and identified with the same identification number as the first wire being tested.

When the wire is disconnected from the receiver, the transmitter automatically steps down to the next wire in the sequence and supplies current to that wire so that the corresponding diode is illuminated at the receiver. The process is continued until all of the wires have been checked for continuity.

DESCRIPTION OF THE PREFERRED EMBODIMENT

Referring to the drawings, the numeral 10 refers to an elongated metal conduit having a plurality of individual wires 12 extending therethrough. The numeral 14 refers to the continuity tester of this invention which is comprised of a transmitter output unit 16 and a receiver input unit 18.

Figure 5:
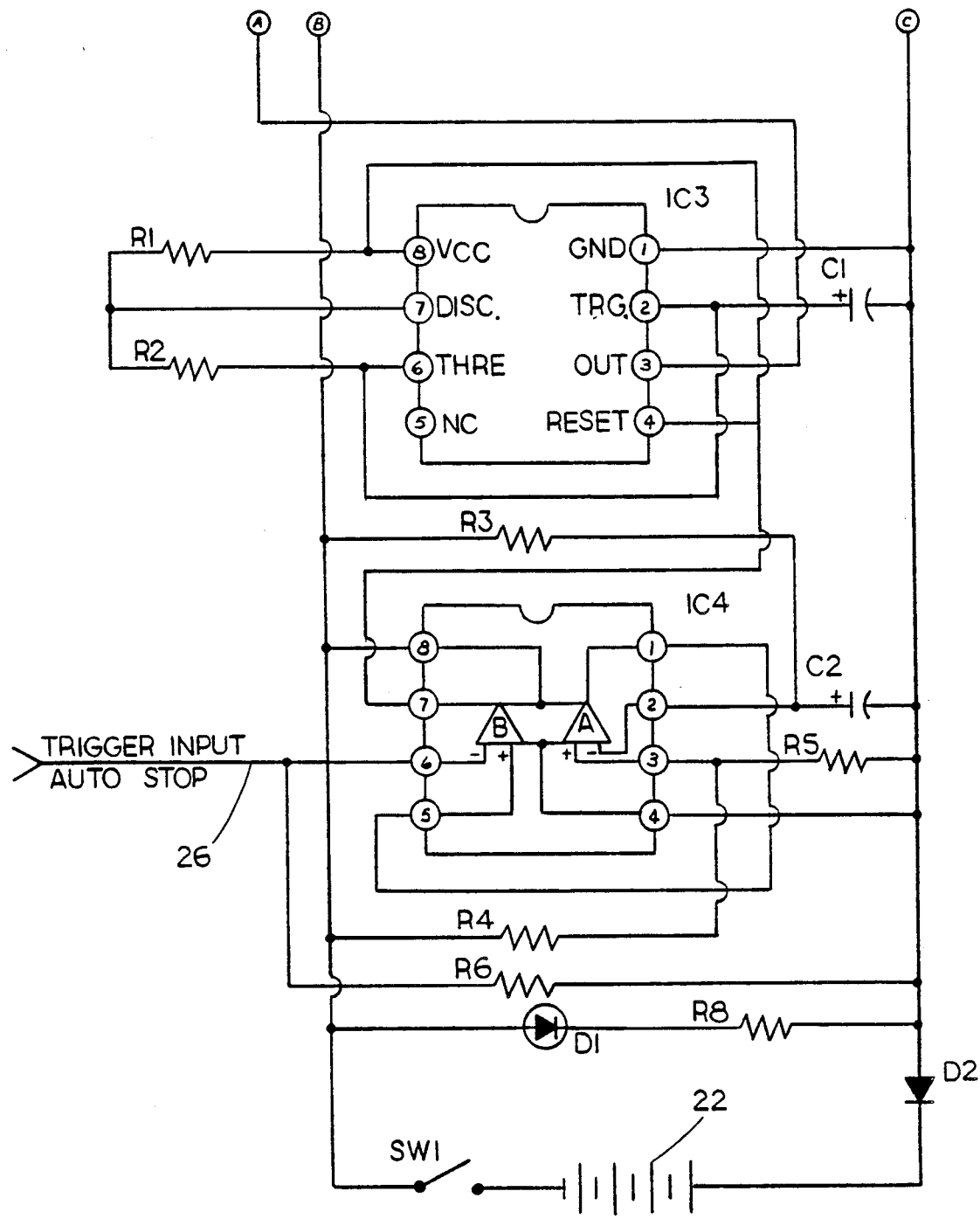

Transmitter 16 generally comprises a circuit board 20 having a 9-Volt battery 22 operatively mounted thereon. Switch SW1 is operatively connected to the battery 22 for supplying electrical power to the circuit illustrated in the drawing. A plurality of individual wire connectors 24 are mounted on a circuit board 20 and are adapted to have the ends of the wires 12 mounted thereon. The connectors 24 will be provided with some means of identification such as numbers 1-32 although the drawings only illustrate 20 of the connectors 24 being utilized. Ground wire 26 is provided for grounding the circuit. The various other components of the circuit for the transmitter 16 are illustrated in FIGS. 4 and 5 with the conventional identifying designations.

Figure 6:
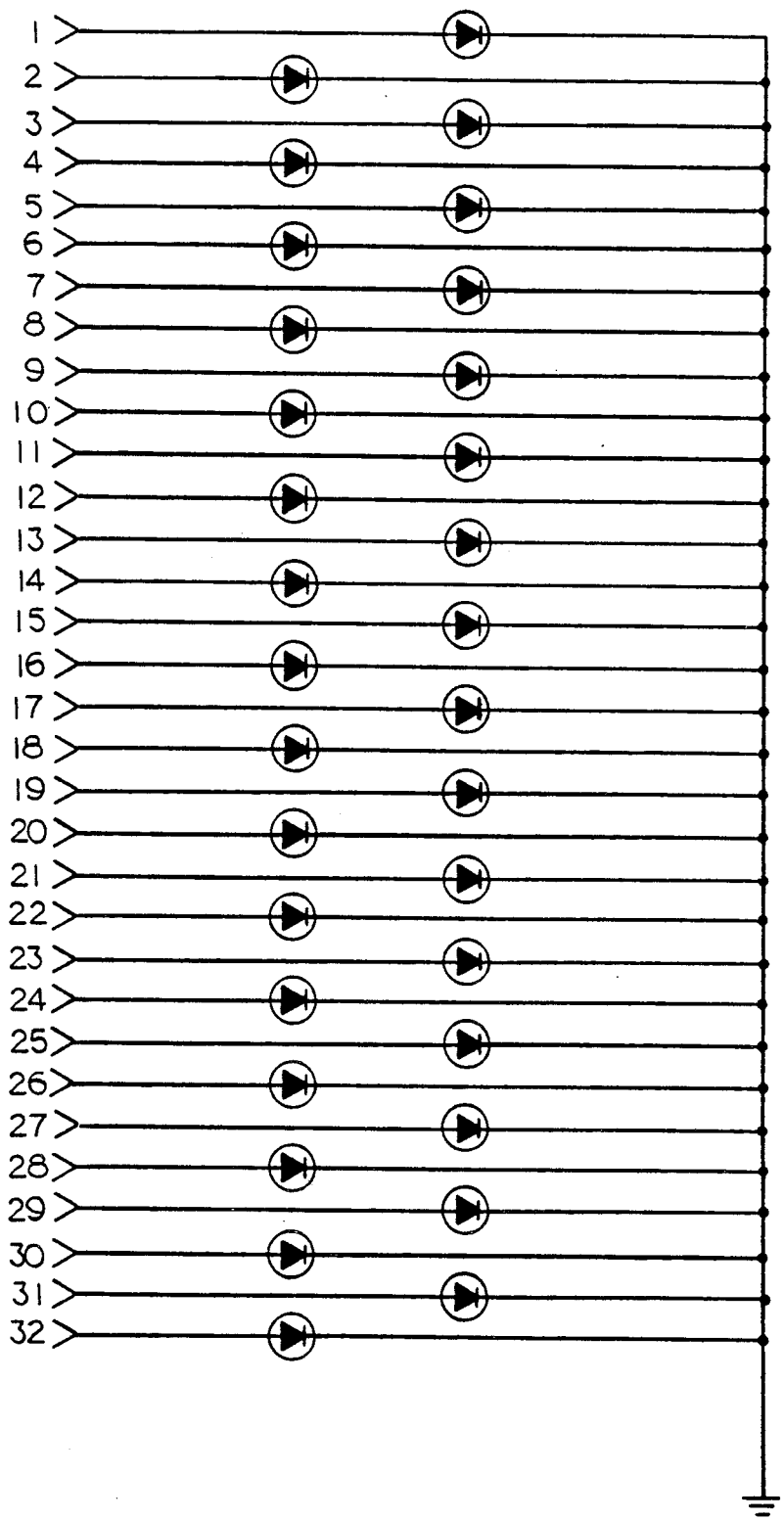

Receiver input unit 18 also includes a circuit board 28 having a plurality of the wire connectors 24, mounted thereon which are adapted to have the other ends of the wires 12 connected thereto. A conventional diode 30 is provided for each of the connectors 24, and are operatively electrically connected thereto as illustrated in FIG. 6. Grounding wire 32 extends from the circuit of the receiver unit 18 as illustrated.

Once the wires 12 have been extended through the conduit, the wires 12 are connected to the connectors 24 in an sequence. Once the wires 12 have been secured to the connectors 24, the wires will be sequentially numbered as 1-32. The other ends of the wires 12 are secured in any sequence in the connectors 24'. Thus, continuity of the individual wires 12 may be tested through the use of the transmitter 16 and the receiver 18 as follows.

When the transmitter 16 is first turned on by SW1, the LED(D1) lights up indicating that the unit is on. The first half of IC4 is used as a start up timer. R3 and C2 form an RC circuit. C2 gradually charges to 9-Volts through R3. When the voltage on C2 exceeds the reference voltage supplied to the non-inverting output of the Op-Amp, its output swings from High to Low voltage output, and stays at a Low until the next power up. This High-Low swing takes two seconds.

While output Pin #1-IC4 is High it sets the reference voltage on Pin #5-IC4 to High, causing output Pin #7-IC4 to go on High voltage to Pin #4 & #8-IC3 (which is a 555 timer).

The timer will run for two seconds during power up, to reset the 32-outputs on IC2 to a low voltage. The reason for this is that the IC2's outputs are all high when they are first powered up and need to be in the low position. After the two second run, Pin #1-IC4 goes back to a Low and changes the reference voltage of Pin #5-IC4 to a Low, which keeps the output Pin #7-IC4 High which will keep the 555 timer running.

IC1 is a Nor-gate and is a High-Low logic chip. The input on Pin #9-IC1 is Low from Pin #2-IC2, and Pin #-IC1 is held High by R7. When Pin #8-IC1 is brought Low by SW2 momentarily, then the output of Pin #10-IC1 goes High momentarily into Pin #39-IC2, which causes the first output of Pin #38-IC2 to go High. Now this High voltage from Pin #38-IC2 of the transmitter, goes down the wire to the receiver to an unknown pin or connector and thus, lights up a LED and goes to ground.

The High voltage on the back side of the particular LED, which is attached to ground and goes through ground, which is also connected to the trigger input on the transmitter which is connected to ground, is sensed by Pin #6-IC4 and causes the output Pin #7-IC4 to go Low which stops the 555 timer.

The wire is removed from the receiver corresponding to the illuminated LED and is identified with the same indicia or identification as the wire being tested. In other words, if wire #1 is being tested, the first LED illuminated at the receiver will correspond to wire #1 and that wire will be so identified.

As soon as the first wire (1) is removed from the receiver input that has an illuminated LED, Pin #6-IC4 will sense the voltage drop and start the 555 timer which shifts the output down step, and the High voltage goes out Pin #37-IC2 down the second wire to the receiver, lights the LED and down to the ground which is sensed by Pin #6-IC4 and stops the 555 timer. This cycle is continued over and over until all of the wires have been checked labeled. The apparatus may be re-loaded and the reset button reset to start the cycle over.

It should be noted that D2 is used to protect the circuits in case of improper battery installation. D3 is the same LED as D1 but used to indicate that there is a connection. R1 and R2 are hooked to Pin #6, 7, 8-IC3 to determine the width of the square wave of the clock pulse. C1 is used on Pin #2-IC3 and is tied High and R5 is tied Low keeping the non-inverting reference point from floating High or Low. R6 and R8 are used to cut the voltage down to the proper operating level for the LED's. R7 is used on Pin #8-IC1 and is tied High to keep this input from floating Low until needed.

It is preferred that the various components of the circuit have the following specifications:
IC 1. 4011 Nor Gate (Texas Instruments)
IC 2. UCN 5818 A Serial-Imput, Latched Drivers (Sprague) Or —TI SN75518 Serial-Imput, Latched Drivers (Texas Instruments)
IC 3. TLC555 Timer (Texas Instruments)
IC 4. TL082 Dual Bifet Op Amp (Texas Instruments)
NOTE:
All Resistors are ¼ Watt unless specified.
R 1. 56K
R 2. 1K
R 3. 100K
R 4. 56K
R 5. 33K
R 7. 33K
R 8. 680.
C 1. 0.1 MF CAP
C 2. 10 MF 35 V. Electrolytic Cap
D 1. 1N914/4148 Silicon Switching Type Diode
D 2. L E D (light-emitting diodes) 2.0 V 20 mA PW 650 nm Lum Int 6.3 mcd
D 3. L E D (light-emitting diodes) 2.0 V 20 mA PW 650 nm Lum Int 6.3 mcd
T1&2 (SN#46F911 Newark#) Type 2SV-16 (Augat Reed Devices Inc.)
SW 1. On-Off
SW 2. Reset Mom On.

Thus, it can be seen a novel continuity tester has been provided which eliminates many of the shortcomings of the prior art. The tester of this invention is convenient to use and automatically steps-down to the next wire in the sequence after the preceding wire has been tested, removed from the receiver and labeled. Thus, it can be seen that the invention accomplishes at least all of its stated objectives.

I claim:

1. A continuity tester comprising,
a continuity transmitter adapted to have the ends of a plurality of wires electrically connected thereto,
means associated with said transmitter for sequentially transmitting electrical current along the length of the wires,
a continuity receiver adapted to have the other ends of the wires electrically connected thereto,
and a plurality of visual signalling devices on said receiver which are individually actuated when current is transmitted along the length of the associated wire so that the continuity and identification of the individual wires may be ascertained,
said transmitter comprising an automatic step-down scanning device,
said step-down scanning device sequentially transmitting current along the individual wires as the continuity of the individual wires is ascertained at said receiver and electrically disconnected therefrom.

2. The method of ascertaining the continuity of the individual wires of a plurality of wires extended through a conduit from one location to a second location, comprising the steps of:
assigning an identifying designation to each of the wires at said one location,
sequentially connecting one end of each of the wires at said one location to an apparatus for sequentially transmitting a small amount of current through each of the wires,
connecting the other ends of the wires at said second location to an apparatus which visually indicates which of the wires has current therein,
applying current to one of the said wires at said one location according to the assigned identifying designation,
visually determining which of the wires has current passing therethrough,
assigning an identifying designating to the other end of the wires having current flowing therethrough corresponding to the designation assigned thereto at the transmitter,
electrically disconnecting the tested wire from the circuit, and automatically accessing the next wire for test after the wire under test has been electrically disconnected from the current.

* * * * *